United States Patent [19]
Wan et al.

[11] Patent Number: 5,881,073
[45] Date of Patent: Mar. 9, 1999

[54] CONVOLUTIONAL DECODING WITH THE ENDING STATE DECIDED BY CRC BITS PLACED INSIDE MULTIPLE CODING BURSTS

[75] Inventors: Yongbing Wan; Ram Asokan; Stan Reinhold, all of Cary, N.C.

[73] Assignee: Ericsson Inc., Research Triangle Park, N.C.

[21] Appl. No.: 718,259

[22] Filed: Sep. 20, 1996

[51] Int. Cl.⁶ .................................................... G06F 11/10
[52] U.S. Cl. ...................... 371/43.1; 371/39.1; 371/43.6; 371/43.7; 371/40.1
[58] Field of Search ................... 371/43.1, 39.1, 371/37.4, 37.7, 32, 43.7, 37.6, 2.1, 40.1, 38.1

[56] References Cited

U.S. PATENT DOCUMENTS

| | | | |
|---|---|---|---|
| 5,164,961 | 11/1992 | Grudmundson | 357/229 |
| 5,191,598 | 3/1993 | Bäckström et al. | 375/347 |
| 5,331,666 | 7/1994 | Dent | 375/341 |
| 5,349,589 | 9/1994 | Chennakeshu et al. | 371/43.7 |
| 5,465,276 | 11/1995 | Larsson et al. | 375/346 |
| 5,533,067 | 7/1996 | Jamel et al. | 371/37.4 |

FOREIGN PATENT DOCUMENTS 2 252 018  7/1992  United Kingdom .

OTHER PUBLICATIONS

Giovanna D'Aria, et al., "Simulation and Performance of the Pan–European Land Mobile Radio System", IEEE Transactions on Vehicular Technology, vol. 41, No. 2, May 1992, pp. 177–189.

Mark C. Reed, et al., "Turbo–Code Termination Schemes and a Novel Alternative for Short Frames", IEEE, 1996, pp. 354–358.

D. M. Balston, "Pan European Cellular Radio: or 1991 and all that", Electronics & Communication Engineering Journal, vol. 1, No. 1, Jan./Feb. 1989, pp. 7–13.

Article: The Viterbi Algorithm; Inventor: G. David Forney, Jr,; Title: Proceedings of the IEEE, vol. 61, No. 3, Mar. 1973; pp. 268–278.

*Primary Examiner*—Reba I. Elmore
*Assistant Examiner*—McDieunel Marc
*Attorney, Agent, or Firm*—Burns, Doane, Swecker & Mathis, L.L.P.

[57] ABSTRACT

An improved coding and decoding process is disclosed to determine the ending state of a convolutional decoding using Viterbi algorithm without the use of tail bits. The most important information bits are first coded with a block code. The block code word and the rest of the information bits are then split into several bursts. Each burst is coded with a convolutional code. The most important information bit part of the block code word is then placed in the beginning of the code burst for the convolutional encoder. The parity bit part can be placed between the end of the most important information bit part and the end of the code burst. In the convolutional decoding process for each burst, the ending state is determined by detected valid block code word after combining the convolutional decoding processes for all the bursts. The performances of average BER and missed detection rate can be optimized by moving the placement of the parity bit in each message code burst.

19 Claims, 7 Drawing Sheets

CONVOLUTIONAL DECODING WITH THE ENDING STATE DECIDED BY CRC BITS PLACED INSIDE MULTIPLE CODING BURSTS

BACKGROUND

The invention generally relates to methods and apparatus for coding and decoding signals and, more specifically, to methods and apparatus for convolutional decoding.

The instant invention is directed to improving the communication of digital radio information. Digital information may be conceptualized as a message composed of binary bits of information, where each bit can either be a ONE or a ZERO. Any given message is then just a string comprising a number of ONEs interspersed with a number of ZEROs. It will be appreciated that any string of L bits can represent one of $2^L$ unique messages.

One of the fundamental difficulties encountered by radio communications systems is the presence of noise in the communications channels. Noise can cause serious problems in a digital communications environment. Noise encountered during digital radio communications can result in bit errors in the transmitted information. The bit errors, in turn, may render the information useless, or worse (e.g., the receiving system determines the information to be correct when it is actually in error). In order to combat noisy channels, and thereby reduce bit errors, digital radio communications systems typically employ both error detecting and error correcting circuits.

A simple example of error detection coding is as follows: for any one digital message add an identical copy of that message to the original message, transmit both the original and copy, and perform a bit-by-bit comparison of the received message with the received copy. For each bit position, any disagreement between the message and the copy is evidence of a transmission error. The total number of disagreements for a message is a quantitative measure of the reliability of the data transmission. However, it will be appreciated that the total number of disagreements is an inexact measure of reliability because simultaneous errors at the same bit position in both the message and the copy are not recognized as disagreements.

A common technique for error detection is the use of a Cyclic Redundancy Check (CRC). A CRC involves creating a set of parity bits at the transmitter from the information bits desired to be transmitted. The parity bits constitute a "check word" specific to a given message. The check word may be appended to the message so that both are processed through the same transmitter, both are transmitted through the communications channel together, and both are processed through the same decoder at the receiver. A CRC calculator in the receiver may then generate parity bits corresponding to the decoded message bits that were received. The receiver-calculated check word may then be compared with the decoded check word that was received with the message. Any non-compliance indicates an error detected in the transmission.

By way of contrast, a simple example of error correction coding is transmitting several identical copies of a given message and performing a bit-by-bit comparison of all messages received at the receiver. Whether a bit of the message output from the receiver should be a ONE or a ZERO may be decided on the basis of comparing all the bits received for each position of the message and allowing the majority of agreeing bit values received for that bit position to determine the output. Transmission errors generally may be assumed to be randomly distributed among the message copies and will thus be less likely to occur at the same bit position in a majority of the copies, allowing the receiver to determine the correct bit value for each position.

A well known technique for error detection and correction is the use of block codes. Block codes divide the sequence of source digits into sequential blocks of L digits. Each L digit block is mapped into a unique n digit block of output digits, known as a codeword, where n>L. Coded and uncoded blocks are compared on the basis that both systems use the same total time duration for a transmitted message. A block code can be linear or nonlinear. A linear block code can be either cyclical or non-cyclical. A cyclical block code can have correction and detection capability. The ratio of total number of information bits to the total number of bits in the code word (L/n) is referred to as the code rate, and is a measure of code efficiency. The difference (1−L/n) is called the redundancy. The encoder is said to produce an (n, L) code. Block codes are memoryless codes because each output code depends on only one source L-bit block and not any preceding blocks or digits. The lower the code rate, the more efficient the code is. However, block coding has a limited error detection capability. If the number of error bits exceeds the error detection capability of the block code, the decoding process may output a valid code word which is not the transmitted code word. In this case, a missed detection occurs.

Another well known technique for error correction include the use of convolutional codes. Convolutional codes, unlike block codes, depend on the immediately preceding stream of received message bits. In convolutional coding, information bits are encoded and decoded in such a way as to determine bits which are destroyed in transmission. A convolutional code is typically described by the rate of the code, its constraint length, and various parity equations.

For example, a convolutional code having a rate of L/n, wherein n coded bits are produced for each set of L information bits, a constraint length of k, can be implemented in a shift register of length k minus one bit. At each interval, L information bits are shifted into the register and n bits are produced to be transmitted. The coded bits are combinations (linear algebraic functions) of the contents of the shift register and the most recent input bit. These combinations vary, depending on the convolutional code used. Unlike block codes, the coded bits from a convolutional code can not be grouped as information bits and parity bits.

The transmitted bits are decoded at the receiver. The receiver knows the code parameters for the corresponding code used by the transmitter/encoder in order to decode the information. Convolutional decoding corrects errors by determining the information where a bit error has occurred, based upon the past received bits, since the encoded bits are derived from several adjacent information bits.

The error-correcting code attempts to remove any errors that might have been introduced by the channel. Of course, not all errors are correctable. Therefore, error detecting codes are used to determine when error correction can be made and appropriate action taken to correct the bits detected in error. Thus, convolutional error correcting codes can be used in conjunction with error detection codes, such as the CRC, to provide a more robust communications system allowing for both the detection and correction of bit transmission errors.

Convolutional coding is one of the best coding schemes for digital communications where energy efficiency dominates in importance. Among the various decoding methods for convolutional codes, Viterbi's maximum likelihood algorithm is one of the best techniques. One form of Sequential Maximum Likelihood sequence estimation (SMLSE), the Viterbi algorithm permits equipment simplification while obtaining the full performance benefits of maximum likelihood decoding. The decoder structure is relatively simple for short constraint length codes, making decoding feasible at high rates of up to 100 Mbits per second. A complete description of Viterbi's algorithm can be found in "The Viterbi Algorithm" by G. David Fornay, Jr. *Proceedings of the IEEE*, Volume 61, No. 3, March 1973.

The maximum-likelihood receiver implies selecting a code word closest to the actual received message word. Because there are $2^L$ code words, the maximum likelihood decision involves storage of $2^L$ words and their comparison with the received word. However, for a large L, the calculations needed would be extremely difficult, resulting in overly complex decoders, making such calculations impractical.

Figure 1A:
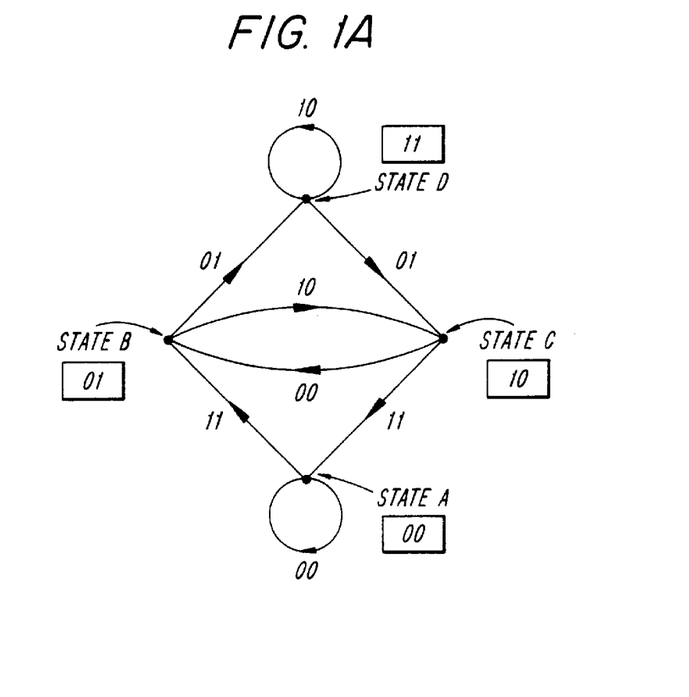
FIG. 1A is an illustrative state diagram for use with a convolutional coder.
Figure 1B:
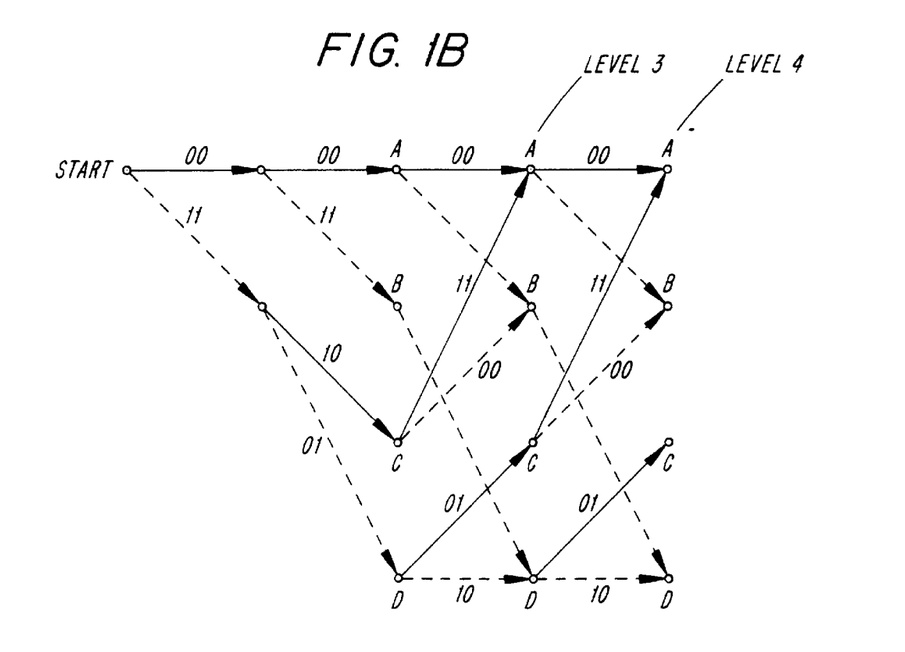
FIG. 1B is an exemplary trellis diagram illustrating the use of the Viterbi decoding.

A major simplification was made through Viterbi or SMLSE. Turning to FIGS. 1A and B, the state and trellis diagram for a Rate=½ and k=3 convolutional coder is shown. In FIG. 1A, note for an encoder having four states that each of the four states (A, B, C, and D) has only two predecessors; that is, each state can be reached through two possible states only, and only the path that agrees most with a received sequence (the minimum distance path) need be retained for each state. FIG. 1B depicts a trellis diagram showing the possible relations between states. Given a received sequence bit, a path in the trellis diagram is determined so that the output sequence from the decoder is the one that most agrees with the received sequence.

For example, suppose the first six digits received are 010001. Consider two paths of three branches for six digits leading to each of the states A, B, C, and D in FIG. 1A. Out of the two paths reaching each state, only the one that agrees most with the received sequence 010001 is retained. This is often referred to as the minimum distance path. The retained path is called the survivor. There are two paths 000000 and 111011 that arrive at the third level state A. These paths are at distances of two and three, respectively, from the received sequence 010001. Hence, the survivor at the third level state is 000000. The procedure is repeated for states B, C, and D. For example, the two paths reaching to the third level state C, the state after three branches, are 001110 and 110101, at distances of five and two, respectively, from the received sequence of 010001. Hence, the survivor at the third level state C is 110101. Similarly, the survivors are determined at the third level states B and D. With four paths eliminated, the four survivor paths are the only contenders. The reason for eliminating the other four paths is as follows: the two paths merging at the third level state A, for example, imply that the previous two data digits are identical. Hence, regardless of what the future data digits are, both paths must merge at this state A and follow a common path in the future. Clearly, the survivor path is the minimum distance path between the two, regardless of future data digits. Then all that needs to be remembered are the four survivor paths and their distances from the received sequence.

Once the survivors at all of the third level states have been determined, the next two received digits are examined. Suppose these are 11 (i.e., the received sequence is 01000111). The two survivors that merge into the fourth level state A are now composed. These are the survivors at states A and C of the third level, with paths 00000000 and 11010111, respectively, at distances of four and two, from the received sequence 01000111. Hence, the path 11010111 is the survivor at the fourth level state A. This procedure is repeated for states B, C, and D, and continues in this manner until the end. Note that only two paths merge at each state and there are only four contending paths (the four survivors at states A, B, C, and D) until the end. Finally, it can be determined how to terminate the trellis and ultimately decide on one final path rather than four. This can be done by forcing the last two digits at the encoder to be, for example, 00. This forces the final state of the code to be A (note that the last two dated digits 00 corresponds to state A). Consequently, the ultimate survivor is the survivor state A after insertion into the coder of two dummy 00s, called tail bits, and transmission of the corresponding four code digits. In terms of the trellis diagram, this means that the number of ending states is reduced from four to two (A and C) by insertion of the first zero into an ending single state A by insertion of the second zero.

By specifying the starting bit and ending bits known as tail bits, the decoder can decode when a complete code word has been received. However, this results in an increased overhead because the ending bits need to be coded in addition to the actual message information bits. In order to reduce this overhead, a technique known as tail-biting is used. According to this technique, the same starting and ending state is used (e.g., forcing the starting and ending state to be 00 in the example above). However, the reduction in overhead comes at the price of not knowing the beginning state or ending state. This tradeoff increases the decoder complexity by at least a factor of two. It should be noted that, while tail-biting provides good performance at low bit error rates (BERs), it provides a degraded performance at higher BERs.

A third method for determining an ending state is to use the accumulated error metric associated with each state. Then, the ending state is chosen that has a minimum accumulated error metric. This technique, however, results in higher average BER.

In order to overcome these various problems, a flexible algorithm which can be used to optimize missed detection rate and bit error rate by detecting the correct ending state for each burst of a convolutionally encoded data stream is needed.

SUMMARY

It is an object of this invention to provide an improved decoding method for use in digital communications for the determination of a correct ending state in each burst of a convolutional decoding, while maintaining source quality and data integrity by providing a low missed detection rate and/or a low bit error rate.

It is another object of the invention to provide improved communications and decoding for digital messages by allowing the coding/decoding to be optimized for either average BER or missed detection based on a system designer's particular system specifications.

The foregoing and other objects are accomplished through the use of Viterbi decoding without the use of tail bits to determine the correct ending state in each burst of a convolutional decoding.

In a conventional decoding process using Viterbi algorithm, both the starting state and the ending state of the decoding trellis have to be determined. The beginning state is usually defined by a known initial state of the convolutional encoder. The ending state is typically defined by the known tail bits at the end of the coding burst. As described above, a disadvantage of using tail bits is the additional overhead bits and increased bandwidth required. Other methods can determine the ending state without the use of tail bits, such as tail biting, or by selecting the ending state with the best measure of a certain merit, such as the best error metrics. However, these techniques can suffer from higher average BER and missed detection rates.

The present invention overcomes these deficiencies by determining the ending state without the use of tail bits without as much susceptibility to high missed detection rates. This is accomplished by placing the most important information bits at the beginning of a burst and initially coding them using a block code (CRC). Then, according to one exemplary embodiment of the invention, the block coded most important information bits and the rest of the bits are split into several bursts called B-bursts. The CRC is placed in each B-burst between the end of the most important block encoded information bits and the end of the B-burst. Each B-burst is then encoded through use of a convolutional code into a C-burst. Once the bursts are convolutionally encoded, they are sent through a communication channel with some form of a digital modulation scheme, such as Quaternary Phase Shift Keying (QPSK) or Gaussian Minimum Shift Keying (GMK). At the receiver end, the demodulated soft bits are fed to the convolutional decoder for extracting information bits using a Viterbi algorithm. Instead of the use of tail bits or tail biting, the ending state of the Viterbi algorithm is determined by block decoding of the most important bits. Thus, according to the present invention, a valid block code word after combining all the decoding processes for all bursts is used to determine the ending states. By adjusting the placement of the CRC within B-bursts, the communication of the message can be optimized for an application for either average BER or missed detection.

BRIEF DESCRIPTION OF THE DRAWINGS

The features and advantages of the invention will be better understood by reading the following description in conjunction with the drawings, in which.

DETAILED DESCRIPTION

The various features of the invention will now be described with respect to the figures, in which like parts are described with the same reference characters.

As previously described above, various coding techniques are used to combat noise in digital communications channels, one such technique being convolutional coding. Convolutional coding, unlike block coding, depends not only on the message bits of the data word itself, but also on the block of previous data digits immediately preceding the received message bits. This allows convolutional codes to be designed to correct for random error. One method for decoding convolutional codes is the Viterbi algorithm. However, a problem with the use of Viterbi decoding is determining the ending state of the coded information.

The beginning state is determined by the initial state of the encoder which does not effect overhead. However, if tail bits are used to determine the end of a coded burst of message bits, then there is an unwanted increase in the overhead and bandwidth due to the inclusion of the extra bits (tail bits) needed to identify the ending state of the coded bursts. As an alternative, tail biting can be used to eliminate this overhead by forcing the beginning and ending states to be the same. Tail-biting is implemented by placing the last m bits into the shift registers as an initial starting state. In this way, the ending state will be exactly the same as the beginning state. However, while tail biting provides good performance on communication channels with low BERs, performance suffers at high BERs because an increased number of bit errors may lead to missed or incorrectly detected ending and starting states. Therefore, according to the present invention, the Viterbi convolutional decoding has been implemented without the need for tail bits and tail-biting.

Figure 2A:
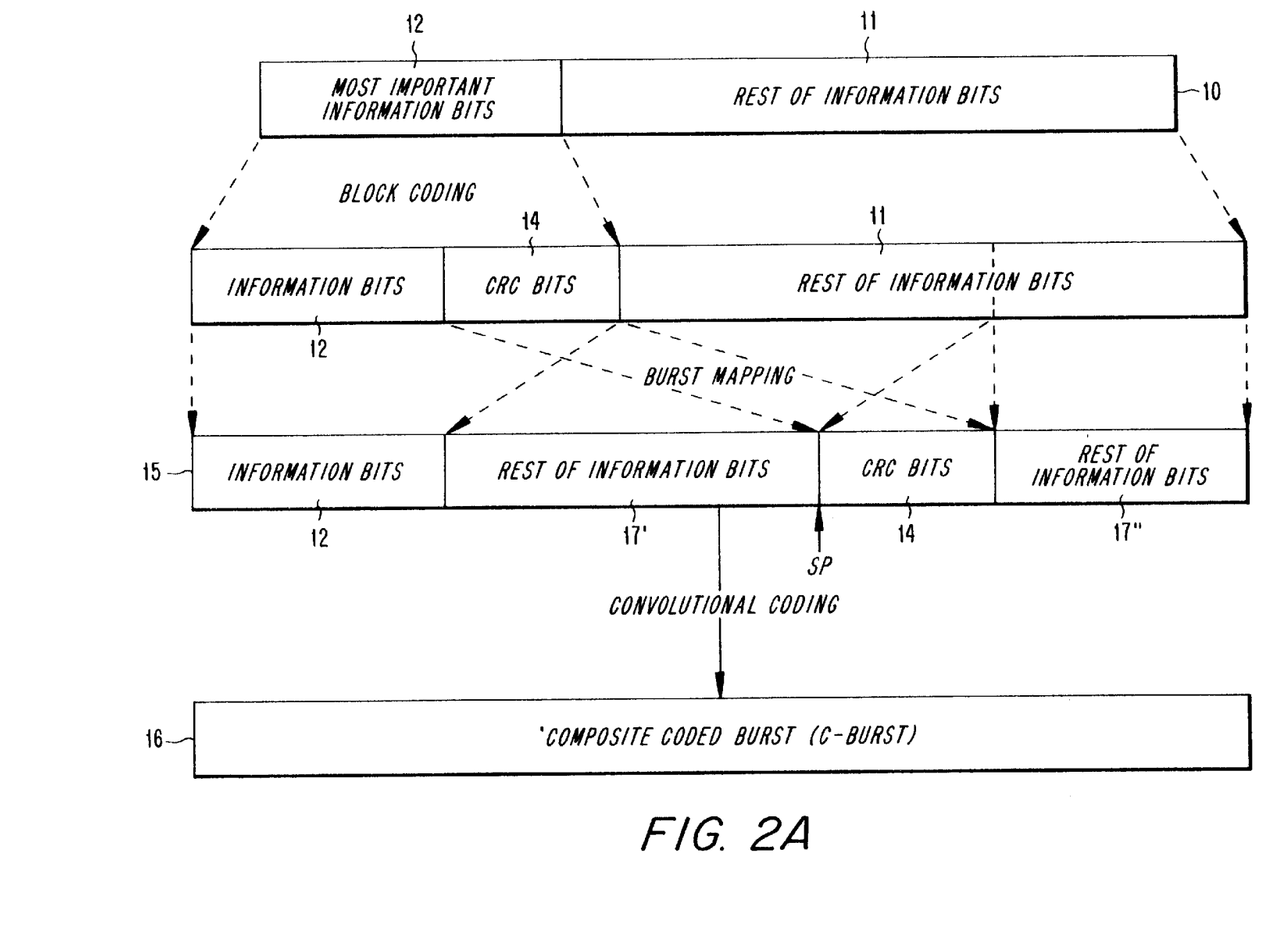
FIGS. 2A and 2B illustrate forming a message according to exemplary embodiments of the invention.

According to one exemplary embodiment of the invention, illustrated in FIG. 2A, for any message of data bits 10, a first portion 12 of the information bits are separated from the remaining information bits. The first portion 12 can, for example, contain the most perceptually significant bits. The most perceptually significant bits may vary from application to application. For example, according to EIA/TIA IS-54, the most perceptually significant bits include code word bits related to frame energy and the first four reflection coefficients. Another example is the gain parameters describing the energy level of speech. After the first portion 12 is separated from the remaining information bits 11, the first portion 12 is block encoded, resulting in the addition of CRC bits 14. However, as mentioned above, block coding has limited error detection capability. If the number of erroneous bits exceeds the error detection capability of the block code, the decoding process will provide a valid code word which is not the same as the transmitted code word. In this case, a missed detection will occur.

Therefore, according to the present invention, the information bits 12, CRC bits 14 and the rest of the information bits 11 forming the message 10, are then convolutionally encoded. With the use of any block coding, there is an inherent limited error detection capability. For instance, if the number of the error bits exceeds the error detection capability of the block code, the decoding process may output a valid code word which is not the actual transmitted code word. In this situation, a missed detection occurs. In addition, if the CRC parity bits are placed at the end of the code burst for the convolutional coding, an incorrect assumption of the ending state may produce a large number of error bits. Again, as a result, a valid code word may be detected, also causing a missed detection to occur. The result of a missed detection of a valid code word in many applications is degraded source quality, such as bad voice quality for a speech compression algorithm. Accordingly, exemplary embodiments of the present invention provide for moving the CRC bits toward the beginning of the burst to decrease the missed detection rate. This concept is depicted in FIG. 2A by the illustrated burst mapping wherein the CRC bits are moved to a starting bit position SP. The way in which positions SP are selected is described in more detail below. The remaining information bits 11 are divided into two segments 17' and 17" to accommodate the positioning of the CRC bits at position SP. After rearranging the burst to position the CRC bits at the desired position SP, the entire burst is convolutionally encoded using known techniques to create a composite coded burst 16.

Another problem with convolutional coding is burst length. The longer the burst length the greater the potential for error propagation when an error occurs in the decoding trellis. Therefore, according to another exemplary embodiment of the present invention, illustrated in FIG. 2B, a shorter burst length is preferred to limit the scope of the error propagation. For example, in cases when a communication channel produces a high BER, the block code word should be split into several bursts 15 and 15' before the convolutional coding.

Figure 2B:
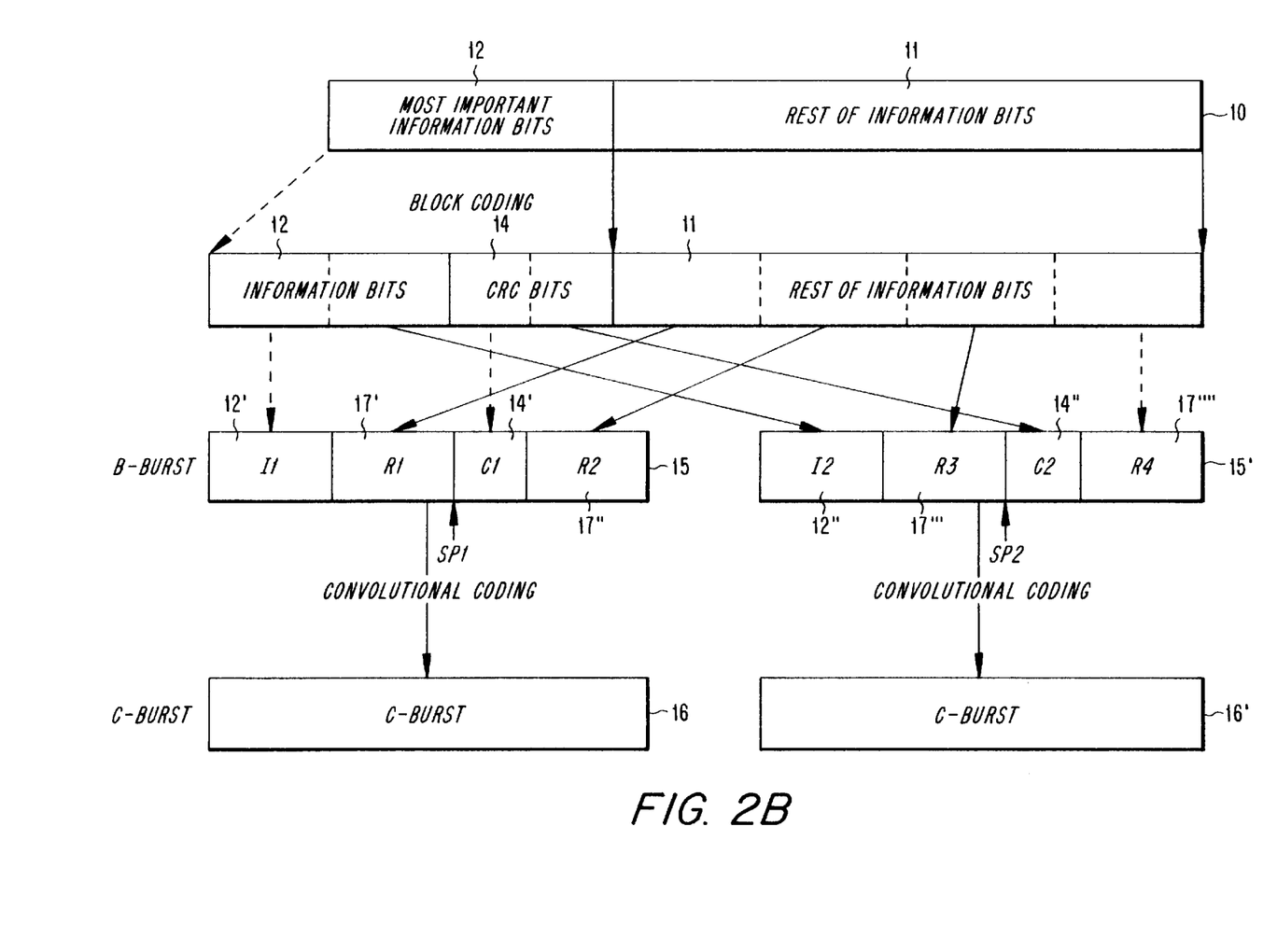

For example, in FIG. 2B, after the first portion 12 has been separated from the rest of the information bits and block encoded, the message is broken up into two bursts, B-burst 1, denoted by reference numeral 15 and B-burst 2, denoted by reference numeral 15'. For example, the first portion 12 can be divided into two segments 12' and 12", each allocated to B-burst 15 and 15', respectively. Likewise, the CRC bits 14 can be divided up into two segments 14' and 14". The remaining bits 11 can be separated into four portions 17', 17", 17'" and 17"" which can be positioned relative to the CRC segments 14' and 14" as shown in FIG. 2B. Like the exemplary embodiment of FIG. 2A, burst mapping is performed to position the CRC bits 14' and 14" at starting positions SP1 and SP2, respectively. The particular placement of the CRC bits, for instance C1, 14' and C2, 14" in FIG. 2B, depends on, for example, the application the message is associated with and will be discussed in more detail below. After burst mapping, each B-burst 15 and 15" is convolutionally encoded to create respective C-bursts 16 and 16'.

Figure 3:
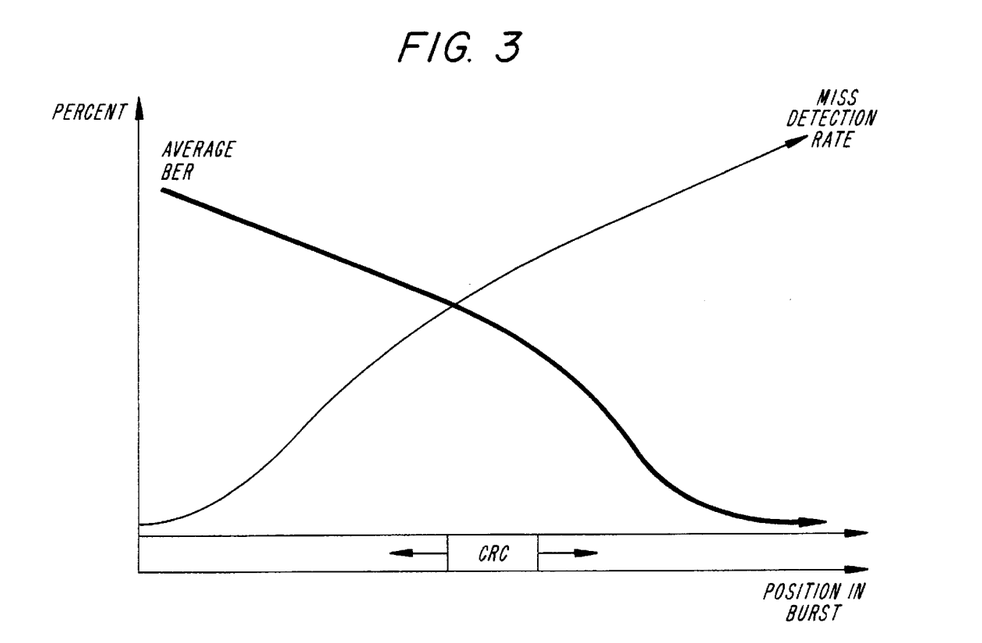
FIG. 3 illustrates a relationship between placement of a CRC parity bit within a coding burst and average BER and missed detection rate.

The techniques for selective placement of the CRC bits will now be described with respect to FIG. 3. By moving the CRC bits in relation to the information portion 12, error performance may be manipulated by allowing the average BER performance to be traded against the missed detection rate of the block decoding process. Turning to FIG. 3, it can be seen that as the CRC bits are placed closer to the end of the code burst, the average BER becomes lower. This occurs because the determination of a correct ending state becomes more reliable. Note, however, that the missed detection rate of the block decoding is higher for CRC starting positions toward the end of the burst because the number of error bits may exceed the error detection capability of the block coding on the determination of incorrect ending states.

On the other hand, as the CRC bits are placed closer to the portion 12 of the information bits at the beginning of the burst, the missed detection rate is lower because the decoding process has progressed fewer stages into the trellis before reaching the CRC bits. However, the average BER will be higher since the probability of having a correct ending state based on a valid code word of the block coding becomes lower. According to the present invention, for a communication application where average BER is more important, the CRC bits can be placed closer to the end of the burst, thus allowing optimal performance in this situation. In contrast, for applications where the miss detection rate is more important, the CRC bits can be placed closer to portion 12 of the information bits (i.e., the most important information bits). Moreover, placement of the CRC bits can be fine tuned for a specific application by iteratively adjusting the placement of the CRC bits within a burst and evaluating at the receiver to determine which CRC field position delivers the best performance.

Figure 4A:
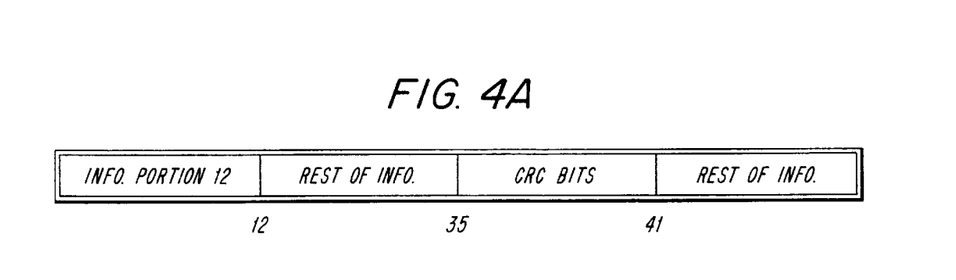
FIGS. 4A and 4B are an examples of the placement of the CRC within a burst.
Figure 4B:
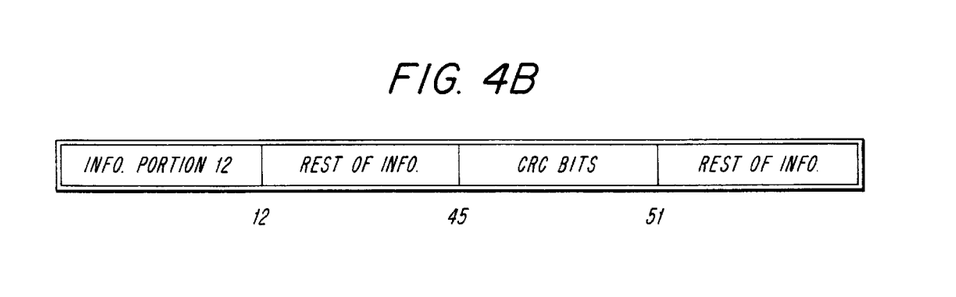

Turning to FIGS. 4A and 4B, an example is shown for the placement of the CRC bits at starting bit locations 35 and 45 within a message burst. According to this example, there are 12 most important bits, 33 rest of the information bits and 6 CRC bits. FIG. 4A shows that the CRC bits are placed beginning at the 35th bit position of the rest of the information bits. FIG. 4B shows an alternative example where the CRC bits are placed beginning at the 45th bit position of the rest of the information bits. Performance characteristics for both CRC bit placement schemes have been contrasted in FIGS. 5A and 5B.

Figure 5A:
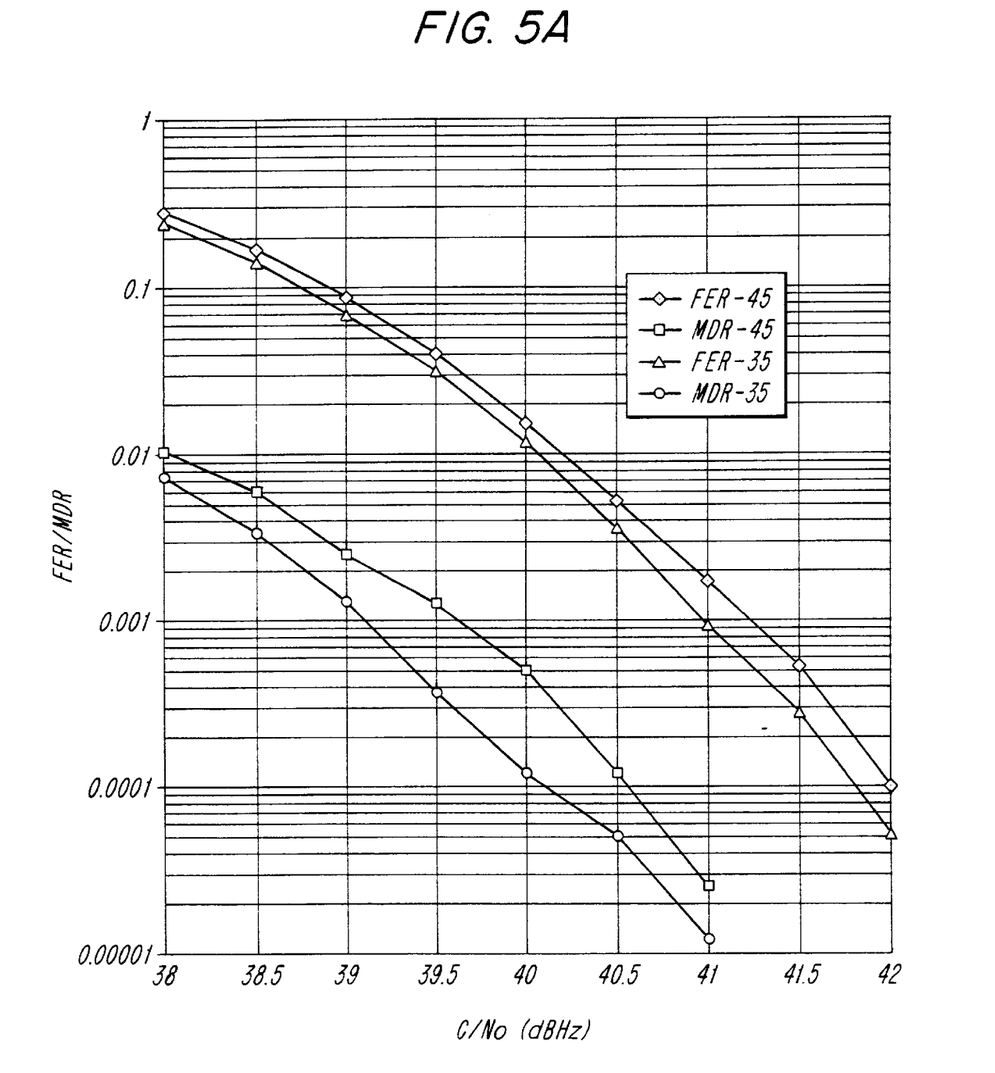
FIG. 5A is an example of the effect of placement of the CRC on missed detection rate and frame error rate.
Figure 5B:
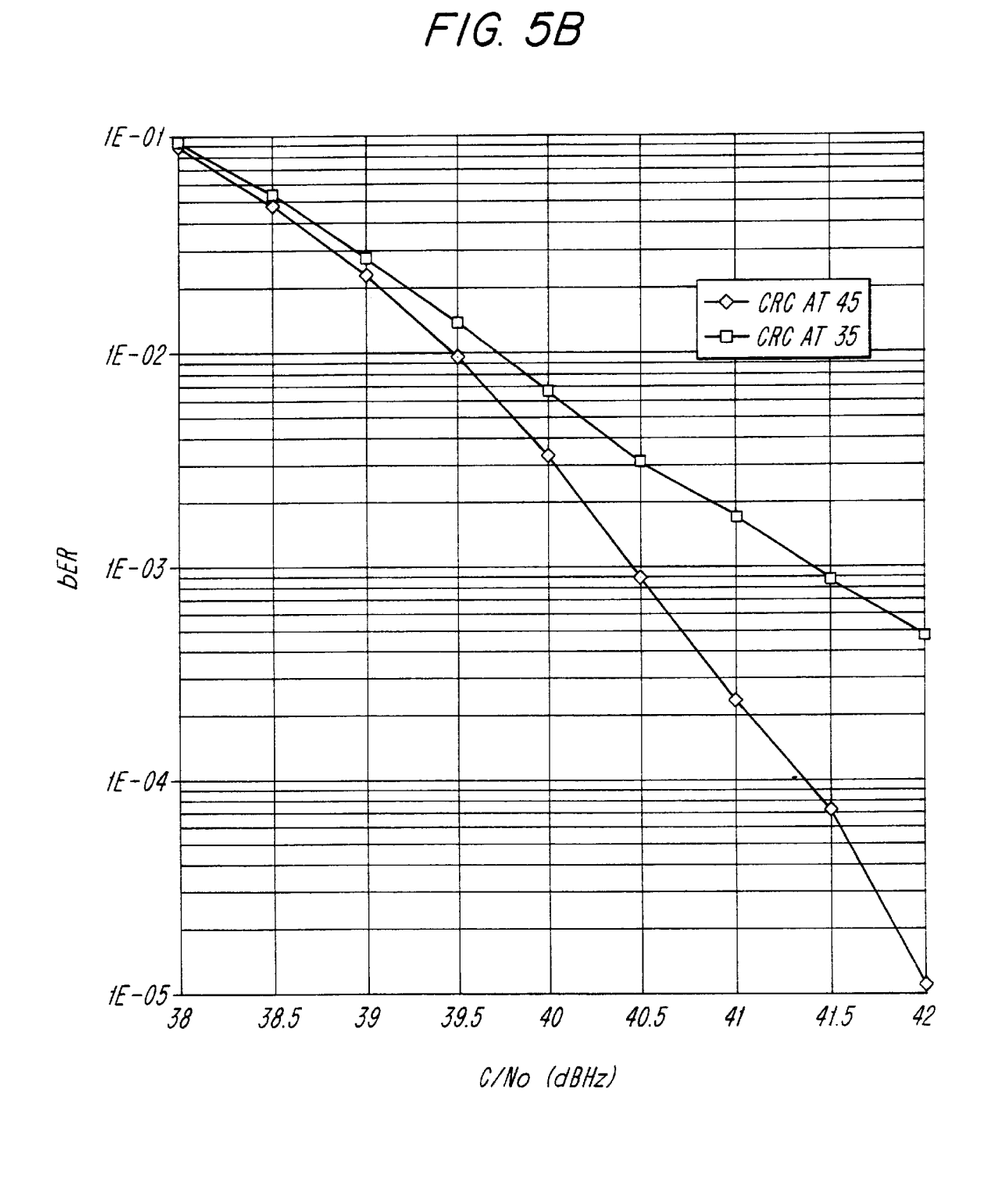
FIG. 5B is an example of the effect of placement of the CRC on average BER.
Figure 6:
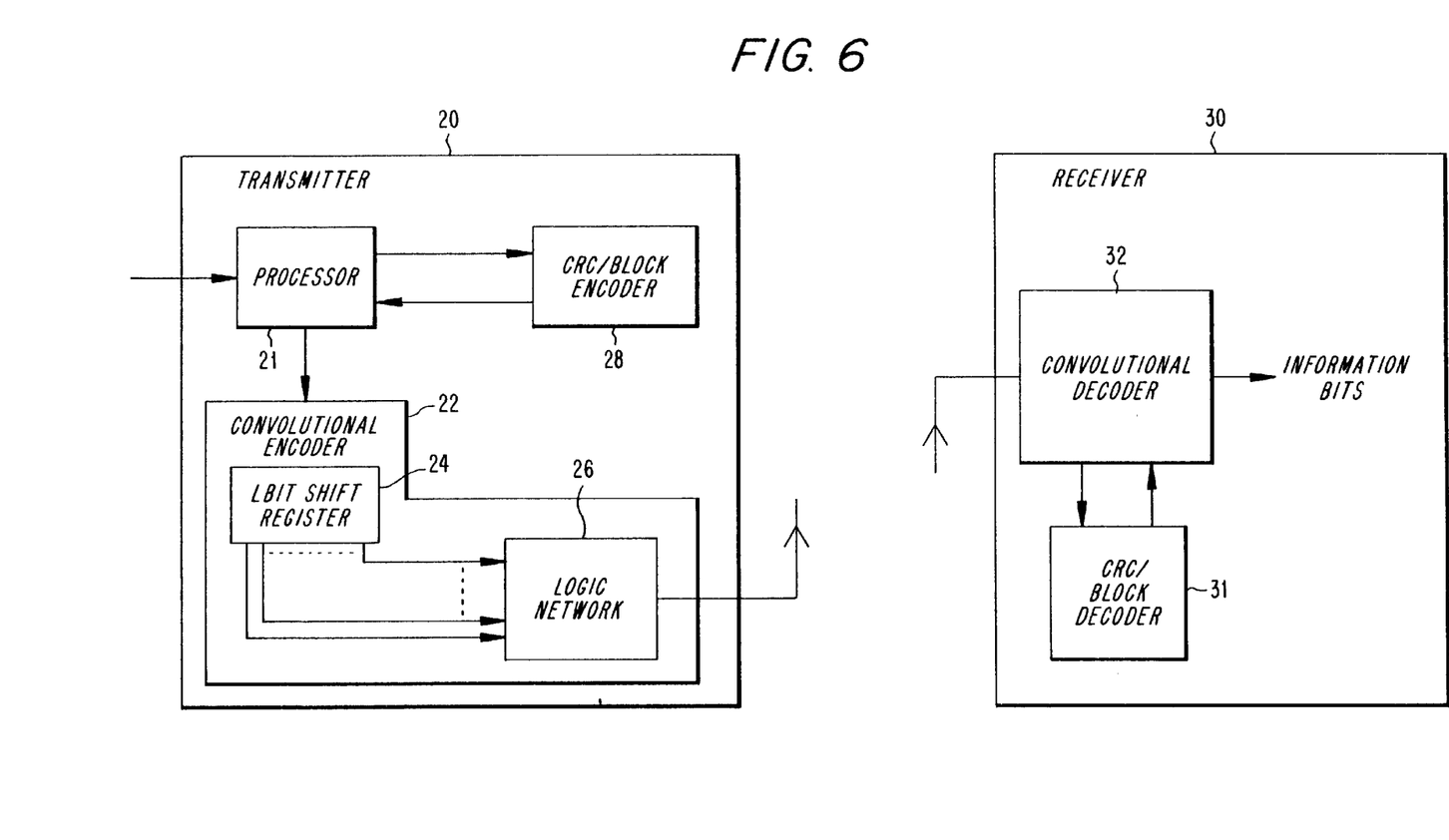
FIG. 6 is an exemplary communications system for use with the invention.

As can be seen from FIG. 5A, the missed detection rate (MDR) and the frame error rate (FER) are reduced as the CRC field is moved forward within the coded burst from a starting position at bit 45 to a starting position at bit 35. Moreover, the difference tends to widen as the carrier-to-noise ratio improves. On the other hand, as illustrated in FIG. 5B, the average BER is increased by moving the CRC from location 45 to 35. Therefore, placing the CRC bits starting at bit position 35, as shown in FIG. 4A, may be used in digital voice transmission where the MDR is more important. Conversely, placing the CRC bits starting at bit position 45, as shown in FIG. 4B, may be used in facsimile transmission where average BER is of more concern.

Thus, the present invention can be used to selectively place the CRC bits at a position within each burst which optimizes selected design criteria. For example, if a system designer were to create a system wherein the frame error rate was less than 0.05 for a carrier-to-noise ratio in excess of 40, then he or she would place the CRC field at a starting bit position of 45 (or possibly greater), since this bit position satisfies the design criteria and also provides a better bit error rate. If, on the other hand, the miss detection rate needed to be minimized regardless of the bit error rate, then the system designer would select a starting bit position of 35 (or less). Those skilled in the art will appreciate that although curves are provided for only the exemplary bit positions of 35 and 45, a whole family of curves can be generated for any potential CRC field starting bit position which will allow a system designer to optimize design criteria for a particular application.

According to one exemplary embodiment the communication system illustrated in FIG. 4A may be used to implement the coding and decoding process according to the present invention. In FIG. 4A a transmitter 20 and receiver 30 are shown. In the transmitter 20, the information bits are divided by processor 21 into the portion 12 described above and the remaining information bits 11. After division the portion 12 of the information bits are fed into a CRC/Block encoder 28 which generates the CRC bits associated with portion 12. After the portion 12 of the information bits has been block encoded, the processor 21 shifts the bits in each burst to move the CRC field to the selected starting position. Then, all of the bits are input to the convolutional encoder 22, which includes a shift register 24 through which the bits of information to be encoded are shifted. The shift register holds a limited number k of bits, the number k being known as the constraint length of the code because the code is to be considered k bits at time. At any instant, the bits in the shift register 24, which may be labeled $B_1, B_2, B_3, B_4, \ldots B_k$, are applied to a combinatorial logic network 26 that generates two or more different Boolean combinations of the bits. The combinations generated by the network 26 are the coded bits, which are described above, and which may be designated $C_1, C_2, \ldots, C_L$. The resulting encoded bits are transmitted over a communication channel to the receiver 30 using some form of digital modulation scheme such as QPSK or GMSK as is known to those skilled in the art.

The receiver includes decoder 32 that converts the information bits back into the data bits $C_1, C_2, C_3, \ldots, C_L$. A CRC/block decoder 31 is provided to determine the valid code words for the convolutionally decoded message bits. When a valid code word is detected by the block decoder, it indicates the end state for the convolutional decoder. After the valid end states have been determined, the message can then be divided up into its original information bits.

The present invention has been described by way of example, and modifications and variations of the exemplary embodiments will suggest themselves to skilled artisans in this field without departing from the spirit of the invention. The exemplary embodiments described above are merely illustrative and should not be considered restrictive in any way. The scope of the invention is to be measured by the appended claims, rather than the preceding description, and all variations and equivalents which fall within the range of the claims are intended to be embraced therein.

What is claimed is:

1. A coding and decoding process for determining the ending state of a convolutionally encoded message having a plurality of information bits comprising the steps of:

dividing the plurality of information bits into a first portion of information bits and remaining information bits;

encoding the first portion of information bits using a block coding scheme to generate parity bits;

placing the block coded information bits at a beginning of a burst, followed by the remaining information bits and placing the parity bits after the block coded information bits and before the end of a burst;

encoding each burst with a convolutional code;

transmitting the convolutionally coded bursts; and receiving and decoding the convolutionally coded bursts, wherein when decoding each burst, the ending state of a burst is determined by detected valid block code word after combining the convolutional decoding processes for all the bursts.

2. The method of claim 1 wherein the decoding the convolutional encoded bursts is accomplished by Viterbi decoding.

3. The method of claim 2 wherein the Viterbi decoding is performed on the bursts without tail biting.

4. The method of claim 1 wherein the parity bits are Cyclical Redundancy Check (CRC) bits.

5. The method of claim 4 wherein the average Bit Error Rate (BER) and missed detection rate are optimized for the message transmission.

6. The method of claim 5 wherein the average BER is decreased by placing the CRC check later in a burst.

7. The method of claim 5 wherein the missed detection rate is lowered by placing the CRC check earlier in a burst.

8. The method of claim 1, further comprising the step of:

splitting the block coded information bits and the remaining information bits into several bursts.

9. A digital communications system for transmitting and receiving a message burst comprising:

a transmitter unit for transmitting said message burst having a number of information bits, said transmitter including:

means for separating a portion of the information bits from remaining information bits, a parity bit generator for generating a checkword for the portion of the information bits;

means for selectively positioning said checkword among said portion of said information bits and said remaining information bits to generate a mapped message burst, such that at least some of said remaining information bits are disposed at an end of the message burst; and means for convolutionally encoding the mapped message burst.

10. The system of claim 9 further comprising:

a receiver for receiving transmitted encoded message bursts including:

a message burst decoder; and a parity bit decoder, wherein when decoding each message burst, the ending state of the message burst is determined by detecting a valid block code word.

11. The system of claim 10 wherein the encoder is a convolutional encoder and the message burst decoder is a convolutional decoder.

12. The system of claim 11 wherein the decoding of the convolutionally encoded bursts is accomplished by Viterbi decoding without the use of tail biting.

13. The system of claim 12 wherein the parity bits are Cyclical Redundancy Check (CRC) bits.

14. The system of claim 10 wherein the means for selectively positioning said checkword positions said checkword such that the average Bit Error Rate (BER) and missed detection rate are optimized for the message transmission.

15. The system of claim 14 wherein the average BER is decreased by positioning the checkword later in a burst.

16. The system of claim 14 wherein the missed detection rate is decreased by positioning the checkword earlier in a burst.

17. A method for coding a message comprising the steps of:

identifying a parameter associated with positioning of an error detection field;

selecting a position for said error detection field within said message based on a desired value for said parameter;

shifting information bits within said message to accommodate positioning of said error detection field at said selected position; and convolutionally encoding said shifted message.

18. The method of claim 17, wherein said error detection field is a CRC field.

19. The method of claim 17, wherein said step of identifying a parameter further comprises the step of:

identifying at least one of frame error rate, missed detection rate and bit error rate.

* * * * *